(12) United States Patent
Canonne et al.

(10) Patent No.: US 10,005,384 B2
(45) Date of Patent: Jun. 26, 2018

(54) ANTI-DAZZLE HEADLAMP

(71) Applicant: VALEO VISION, Bobigny (FR)

(72) Inventors: Thomas Canonne, Poissy (FR); Antoine De Lamberterie, Paris (FR); Guillaume Thin, Guyancourt (FR); Samira Mbata, Aubervilliers (FR); Olivier-Sebastien Lesaffre, Pantin (FR)

(73) Assignee: VALEO VISION, Bobigny (FR)

( * ) Notice: Subject to any disclaimer, the term of this patent is extended or adjusted under 35 U.S.C. 154(b) by 0 days. days.

(21) Appl. No.: 15/446,635

(22) Filed: Mar. 1, 2017

(65) Prior Publication Data

US 2017/0253172 A1    Sep. 7, 2017

(30) Foreign Application Priority Data

Mar. 2, 2016  (FR) ..................... 16 51781

(51) Int. Cl.
*B60Q 1/14*   (2006.01)
*B60Q 1/08*   (2006.01)
(Continued)

(52) U.S. Cl.
CPC ............ *B60Q 1/04* (2013.01); *B60Q 1/0023* (2013.01); *B60Q 1/085* (2013.01); *B60Q 1/1423* (2013.01); *F21S 41/141* (2018.01); *F21S 41/285* (2018.01); *F21S 41/36* (2018.01); *F21S 41/663* (2018.01); *F21S 41/675* (2018.01); *F21S 48/115* (2013.01); *F21S 48/1225* (2013.01); *F21S 48/1388* (2013.01); *G06T 7/97* (2017.01); *H01L 27/156* (2013.01); *H05B 33/0827* (2013.01); *H05B 33/0842* (2013.01);
(Continued)

(58) Field of Classification Search
CPC ........ B60Q 1/04; B60Q 1/0023; B60Q 1/085; B60Q 1/1423; F21S 48/115; F21S 48/1225; F21S 48/1388; F21S 48/1747; F21S 48/1757; H05B 33/0842; H05B 33/0854; H05B 37/0227
See application file for complete search history.

(56) References Cited

U.S. PATENT DOCUMENTS

2005/0219847 A1* 10/2005 Ikeda .................. G02B 3/0056
                                                          362/268
2015/0160454 A1*  6/2015 Bhakta ............... G02B 26/0833
                                                          362/513

FOREIGN PATENT DOCUMENTS

CN    102826038 A  * 12/2012
CN    104276076 A  *  1/2015
(Continued)

OTHER PUBLICATIONS

French Preliminary Search Report dated Nov. 23, 2016 in Patent Application No. FR 1651781 (with English translation of categories of cited documents).
(Continued)

*Primary Examiner* — Tung X Le
*Assistant Examiner* — Raymond R Chai
(74) *Attorney, Agent, or Firm* — Oblon, McClelland, Maier & Neustadt, L.L.P.

(57) ABSTRACT

A vehicle headlamp includes at least one light-emitting diode that operates as a detector of a light source. The headlamp also includes a first memory that records whether the at least one light-emitting diode detects the light source when the at least one light-emitting diode last operated as the detector of the detected light source.

19 Claims, 10 Drawing Sheets

(51) Int. Cl.
*F21V 14/00* (2018.01)
*B60Q 1/04* (2006.01)
*B60Q 1/00* (2006.01)
*F21S 8/10* (2006.01)
*H05B 33/08* (2006.01)
*H05B 37/02* (2006.01)
*H01L 27/15* (2006.01)
*G06T 7/00* (2017.01)
*F21S 41/141* (2018.01)
*F21S 41/20* (2018.01)
*F21S 41/36* (2018.01)
*F21S 41/663* (2018.01)
*F21S 41/675* (2018.01)
*F21Y 115/10* (2016.01)
*F21Y 105/10* (2016.01)
*H01L 25/075* (2006.01)

(52) U.S. Cl.
CPC ......... *H05B 37/0227* (2013.01); *B60Q 1/143* (2013.01); *B60Q 2300/056* (2013.01); *B60Q 2300/312* (2013.01); *F21Y 2105/10* (2016.08); *F21Y 2115/10* (2016.08); *H01L 25/0753* (2013.01)

(56) References Cited

FOREIGN PATENT DOCUMENTS

| | | | |
|---|---|---|---|
| DE | 10 2008 032 345 A1 | 1/2010 | |
| DE | 102008032345 A1 * | 1/2010 | ........... B60Q 1/1423 |
| DE | 10 2013 104 274 A1 | 10/2014 | |
| DE | 102013104274 A1 * | 10/2014 | ......... G06K 9/00791 |
| EP | 1 780 462 A1 | 5/2007 | |
| EP | 1780462 A1 * | 5/2007 | ............ B60Q 1/085 |
| EP | 1 950 089 A1 | 7/2008 | |
| EP | 1950089 A1 * | 7/2008 | ......... B60Q 1/0023 |
| FR | 2 641 237 A1 | 7/1990 | |
| FR | 2641237 A1 * | 7/1990 | ............ B60Q 1/085 |

OTHER PUBLICATIONS

Raoul de Charette, et al., "Fast Reactive Control for Illumination Through Rain and Snow" IEEE International Conference, XP032185756, Apr. 28, 2012, 10 Pages.

* cited by examiner

ANTI-DAZZLE HEADLAMP

FIELD OF THE INVENTION

The present invention relates to the field of vehicle headlamps, and in particular that of headlamps allowing the dazzle experienced by a driver to be attenuated.

BACKGROUND

It has been known for long time that the light beam emitted by a headlamp, such as a low beam or a high beam, may dazzle the driver because the light beam may reflect from elements of the scene that is illuminated by the headlamp. FIG. 1 illustrates this problem. Illuminated elements of the scene that are liable to reflect light in particular include natural elements such as raindrops or snowflakes. Furthermore, during periods of bad weather, the visibility of the driver is not satisfactory because of multiple reflections of the light emitted by his vehicle.

A known device for countering this problem is illustrated in FIG. 2. The device includes a video camera that detects raindrops, and the light beam of the two headlights is modified in order for the detected drops to no longer be illuminated. However, this solution is ineffective because the means that it implements do not allow an analysis in a sufficiently short time and hence the corrections made to the headlamps are no longer valid when made.

The aim of the present invention is to provide a solution that mitigates these drawbacks. More particularly, the invention aims to provide a device and a method for detecting and occluding reflective elements of a scene illuminated by headlamps that is simple and effective, and that allows the illumination of the scene to be rapidly corrected.

SUMMARY OF THE INVENTION

To this end, the present invention proposes a vehicle headlamp that comprises at least one light-emitting diode, said at least one of the diodes being configured to operate as a detector of a light source. In this way, the physical properties of the diodes are exploited not only to emit light, but also to convert light into electrical current (or voltage). Thus, the detection of drops no longer relies on the use of a video camera, but uses at least one diode of the headlamp.

The headlamp may also comprise:
 be suitable for being coupled to a control unit that is configured to make said at least one at least one light-emitting diode operate alternately as a detector of a light source and as a light emitter;
 the control unit is furthermore configured to transmit a synchronization signal indicating whether said at least one light-emitting diode is operating as a light emitter or as a detector of a light source;
 the control unit is furthermore configured to alternate the operation of said at least one light-emitting diode on reception of the synchronization signal;
 a first memory that records whether said at least one light-emitting diode detected a light source when said at least one light-emitting diode last operated as a detector of a light source; and a second memory that records whether said at least one light-emitting diode detected a light source when said at least one light-emitting diode operated the time before last as a detector of a light source;
 a computational unit that computes the speed of movement and the direction of the movement of a detected light source by comparing the records of the first and second memories;
 a diode matrix array comprises said at least one light-emitting diode;
 a matrix array of mirrors reflects a light source that is emitted or detected by said at least one light-emitting diode of the matrix array;
 all the diodes of the matrix array operate alternately as light emitters and as detectors of one or more light sources;
 a matrix array of mirrors reflects a light source that is emitted or detected by said at least one light-emitting diode, the mirrors of the matrix array being configured so that only a single mirror can reflect toward said at least one light-emitting diode a light source.

The present invention also proposes a lighting device that comprises at least two headlamps according to the invention.

The device may also comprise:
 said at least one diode of a first headlamp is configured to operate (i) as a light emitter when said at least one diode of a second headlamp is configured as a detector of a light source and (ii) as a detector of a light source when said at least one diode of the second headlamp is configured as a light emitter;
 each headlamp comprises a control unit, the control units being connected to one another in order that the synchronization signal transmitted by the control unit of one of the headlamps be received by the control unit of the other headlamp;
 at least two headlamps are coupled to a control unit that transmits the synchronization signal to the headlamps;
 each headlamp comprises a computational unit;
 said at least two headlamps are furthermore configured to simultaneously emit light.

A method for detecting and occluding light sources is also proposed; the method is implemented with the aforementioned lighting device. The method comprises steps consisting in:
 sending a first synchronization signal;
 after the first synchronization signal has been sent:
  emitting light with said at least one diode of the second headlamp; and
  making said at least one diode of the first headlamp operate as detector of a light source;
 recording in the first memory of the first headlamp whether said at least one diode of the first headlamp detected a light source;
 sending a second synchronization signal;
 after the second synchronization signal has been sent:
  emitting light with said at least one diode of the first headlamp; and
  making said at least one diode of the second headlamp operate as detector of a light source;
 recording in the first memory of the second headlamp whether said at least one diode of the second headlamp detected a light source.

The method may furthermore comprise repeating those steps of the method in which the steps of recording to the second memory of the first or second headlamp are carried out, and may furthermore comprise steps consisting in:
 after the recording in the second memory of the first headlamp, computing with the computational unit the speed and direction of movement of the light source detected by the first headlamp and determining the diodes of the matrix array of the first projector allowed to emit light depending on the computation;

after the recording in the second memory of the second headlamp, computing with the computational unit the speed and direction of movement of the light source detected by the second headlamp and determining the diodes of the matrix array of the second headlamp allowed to emit light depending on the computation;

sending a third synchronization signal;

after the third synchronization signal has been sent, configuring the first and second headlamps so that they simultaneously emit light, only those diodes determined as being allowed to emit light being activated.

A method for detecting and occluding light sources with the aforementioned lighting device is also proposed, wherein the headlamps each comprise a computational unit. The method comprises sending a first synchronization signal of a first headlamp (called the master headlamp) according to the invention to a second headlamp (called the slave headlamp) according to the invention. Following the reception of the first synchronization signal by the second headlamp, said at least one diode of the matrix array of the second headlamp emits light, said at least one diode of the first headlamp operating as detector of a light source after the first synchronization signal has been sent. The first headlamp records in its first memory whether said at least one diode of the first headlamp detected a light source. A second synchronization signal is sent by the first headlamp to the second headlamp. Said at least one diode of the first headlamp emits light after the second synchronization signal has been sent, said at least one diode of the second headlamp operating as detector of a light source after the second signal has been received. The second headlamp records in its first memory whether said at least one diode of the second headlamp detected a light source.

BRIEF DESCRIPTION OF THE FIGURES

Other features and advantages of the invention will become apparent on reading the following detailed description of the invention, which is given by way of example and with reference to the appended drawings, in which.

DETAILED DESCRIPTION

Figure 1:
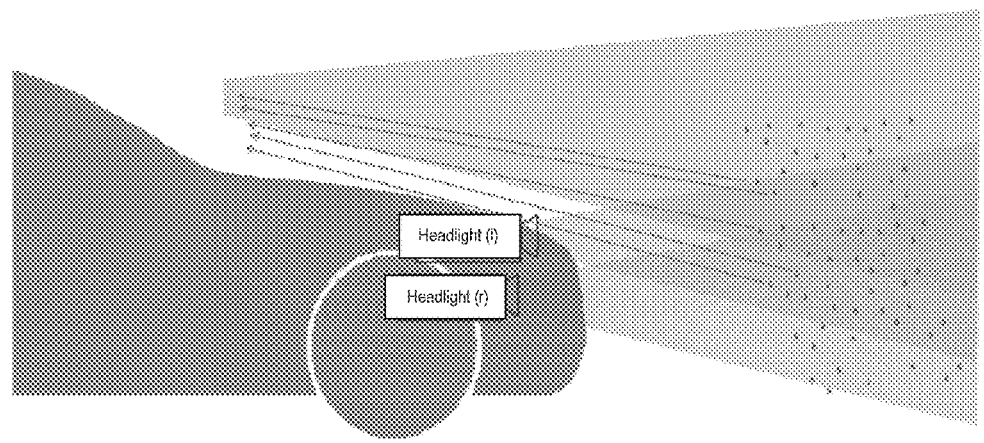
FIGS. 1 and 2 show examples of known prior-art systems of headlamps.
Figure 2:
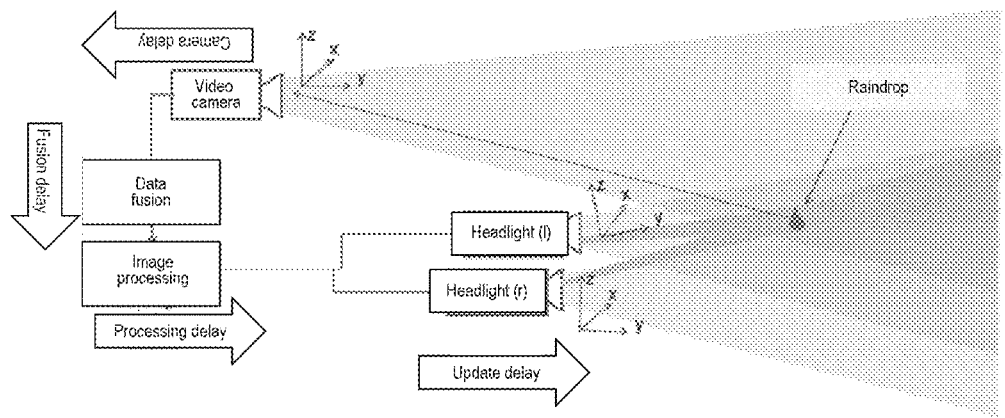
Figure 3A:
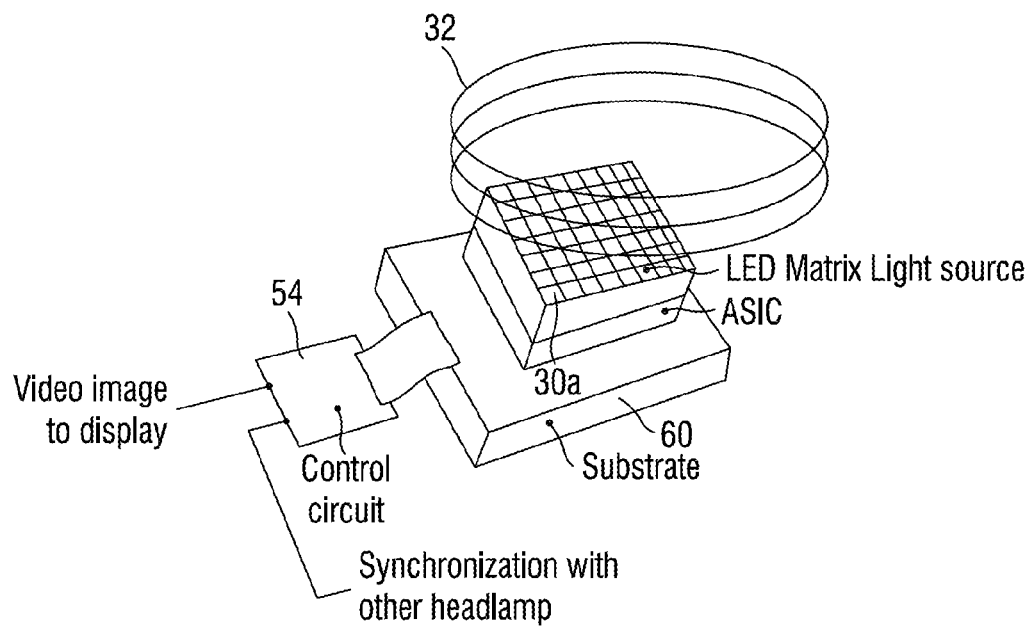
FIG. 3a shows a schematic view of an exemplary headlamp according to the invention.
Figure 3B:
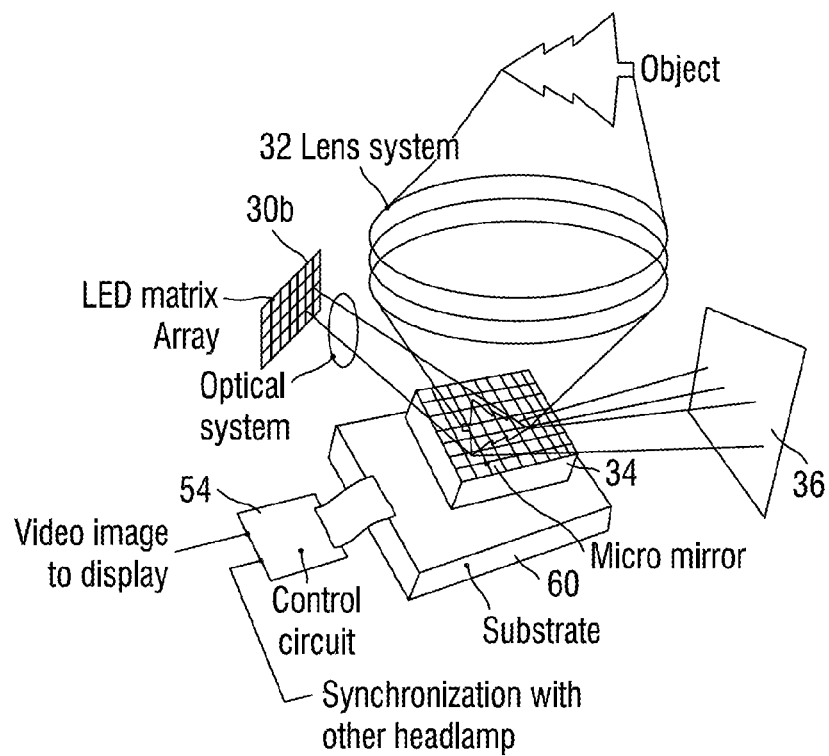
FIG. 3b shows a schematic view of another exemplary headlamp according to the invention.
Figure 3C:
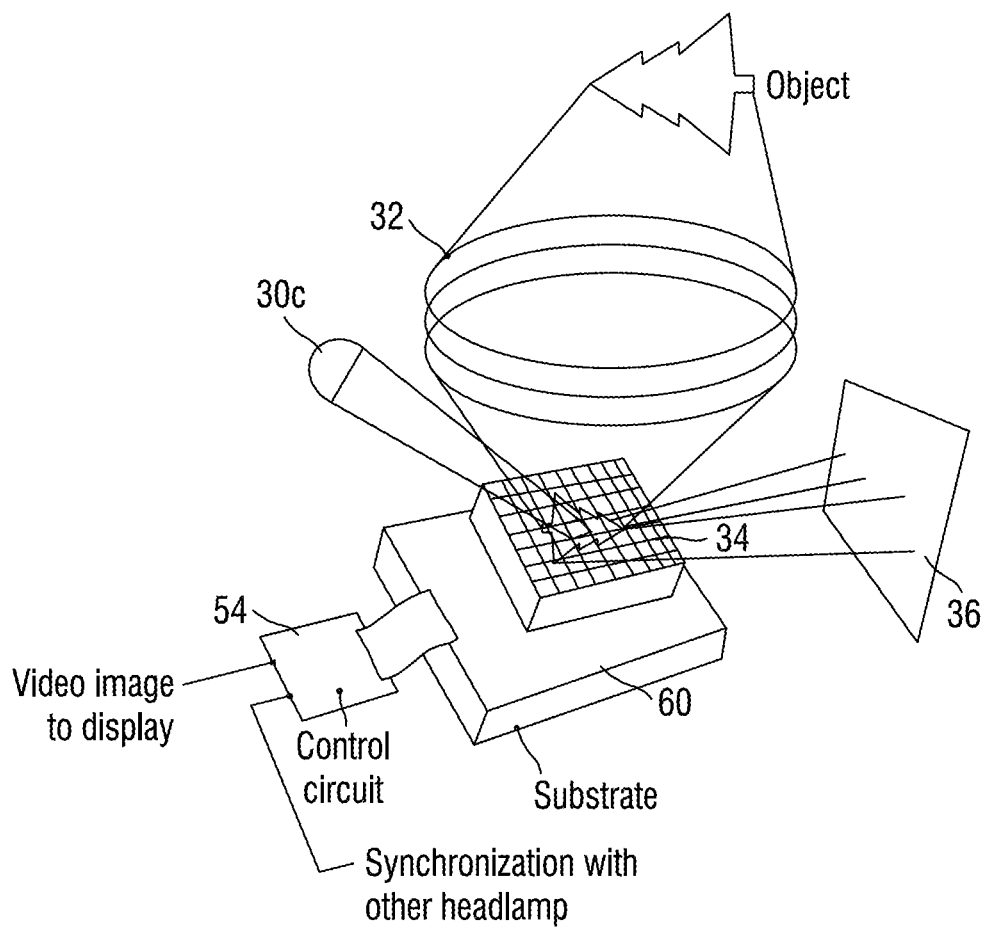
FIG. 3c shows a schematic view of another exemplary headlamp according to the invention.

With reference to FIGS. 3a, 3b, 3c, three exemplary headlamps according to the invention will now be described.

The headlamp may be a headlamp of a ground vehicle, for example a motor vehicle headlight. The headlamp may irrespectively be a left headlamp or a right headlamp of an automobile; for example a front-left or front-right headlamp (the problem of reflection of light being particularly bothersome in this configuration). The headlamp comprises at least one light-emitting diode (LED). The terms LED and diode(s) mean the same thing below.

In the example in FIG. 3a, the headlamp comprises an LED matrix array 30a in which at least one of the LEDs of the matrix array is configured to operate as a detector of a light source. The detected light source is a light source entering into the headlamp; in other words, the light source detected by the headlamp is located outside the headlamp. The term LED matrix array (also known by the French term "grille de DEL" or LED grid) refers to an array of a plurality of LEDs that are arranged in a pattern that may be regular. These arrays allow the incandescent or fluorescent lamps of lighting devices to be replaced, just like as for traffic lights, stoplights, indicators and visibility devices with which motor vehicles are equipped for safety reasons.

In the example in FIG. 3b, the headlamp comprises, in addition to the LED matrix array 30b, a matrix array of mirrors 34 that reflect the light emitted by the LEDs of the matrix array 30b, or indeed that reflect the light emitted by a light source (that is external to the headlamp) toward at least one light-emitting diode of the matrix array. The term matrix array of mirrors (such a matrix also being known by the term digital micromirror device (DMD)) refers to a microelectromechanical system allowing an (optionally pixelated) light source to be projected onto micromirrors. Each mirror may take two positions: each mirror may be inclined along the same axis so as to reflect the light either toward a system of lenses 32 or toward a surface of the LED matrix array 30b. Each micromirror is switched (or tipped) into two different positions called the "on" or "off" position. Each LED of the matrix array is associated with one portion of the mirror matrix array.

Again with reference to FIG. 3b, the number of LEDs of the matrix array 30b and the number of mirrors of the matrix array 34 may be equal so that a single or a plurality of mirrors reflect the light emitted or received by a single LED of the matrix array. It may therefore be a question of a subjective association between one LED and a plurality of mirrors. The number of LEDs of the matrix array 30b may be smaller than the number of mirrors of the matrix array 34 so that the light emitted by one LED is reflected by one or more mirrors and the light received by one LED configured to function as a detector of a light source) is reflected by a plurality of mirrors. In this particular case, the relationship between the LEDs and the mirrors is such that N mirrors of the matrix array form a group of mirrors that are associated with a single LED; preferably, the mirrors of the group all have a position that is identical (all "on" or indeed all "off"). Lastly, the number of LEDs of the matrix array 30b may be larger than the number of mirrors of the matrix array 34 so that the light emitted by a plurality of LEDs is reflected by a single mirror and the light received by a plurality of LEDs (configured to operate as detectors of a light source) is reflected by one mirror. The relationship between the LEDs and the mirrors is such that N LEDs of the matrix array form one LED group and are associated with a single mirror; preferably, the LEDs of a group are, either all configured to operate as detectors of light sources, or configured to operate as light emitters.

In the example in FIG. 3b, the headlamp may furthermore comprise an absorbing surface 36 that limits the reflections of the light source entering into the headlamp via the mirrors that are not positioned to reflect the light toward the LED matrix array 30*b*.

In the example in FIG. 3*c*, the headlamp comprises one LED 30*c*, a matrix array of mirrors 34 that reflect the light emitted by the LED 30*c* or indeed that reflect toward via the LED 30*c* a light source entering into the headlamp. When the LED emits light, the mirrors of the matrix array are positioned so that the light emitted is sent toward the system of lenses 32. Thus, the mirrors may be positioned to form and redirect an image to the system of lenses 32.

Again in the example in FIG. 3*c*, when the LED is configured to operate as a detector of a light source, the mirrors of the matrix array are configured so that a single mirror of the matrix array 34 is able to reflect the light source that must be detected by the LED 30*c*. Thus, when the LED is configured to operate as a detector of a light source, each mirror of the matrix array, one after the other, is placed in the position allowing light to be redirected from a light source to the LED. The other mirrors of the matrix array (i.e. all the mirrors except that in the position allowing the light to be redirected from a light source to the LED) are in a position in which the light of the light source is not reflected toward the LED. The headlamp may furthermore comprise an absorbing surface 36 that limits the reflections of the light source entering into the headlamp via the mirrors which are not positioned to reflect the light toward the LED 30*c*.

The example in FIG. 3*a* is the simplest to implement among the three examples because the LED matrix array illuminates and detects directly. The example in FIG. 3*b* in particular allows an LED matrix array having a number of LEDs smaller than that in FIG. 3*a* to be used while preserving a granularity in the detection similar to that of FIG. 3*a*; the management of the LED matrix array is simplified and the acquisition of an image of the scene (and of light sources of the scene) is more rapid. The example in FIG. 3*c* allows a single LED to be used as light emitter/light detector, thereby facilitating the management of the LED (only a single ASIC is required for example) and decreasing the manufacturing cost of the headlamp.

In the present invention, at least one LED serves as light source, i.e. one or more LEDs emit light (photons) under the action of an electric voltage applied to the P-N junction of the LED(s). At least one LED comprised in the headlamp also serves as detector of a light source, i.e. photons emitted by a light source are captured level with one or more LEDs of the matrix array, which generate(s) an electrical current as a result. The physical properties of the LEDs are therefore used (alternately) to emit light and to detect the light emitted by elements of a scene. The scene is a space that must be illuminated by the headlamps, i.e. at least some of the space that must be made visible for example to a driver of a vehicle. It will be understood that the scene may be given to change, for example when the vehicle is moving. The light emitted by an element of the scene forms a light source; for example a raindrop is an element of the scene that reflects light and therefore forms a light source. The light sources of the scene are therefore external to the headlamp.

Figure 5:
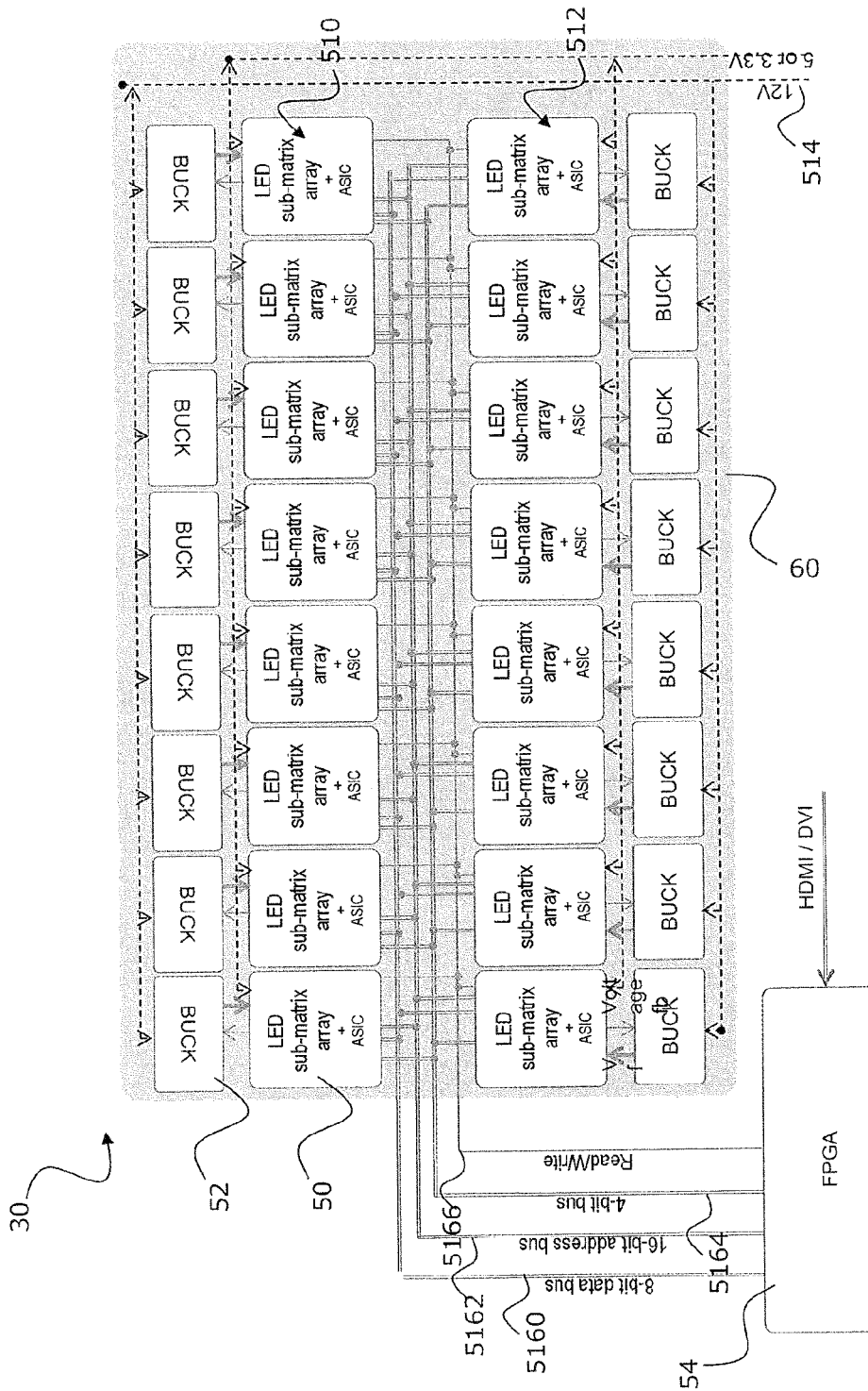
FIG. 5 shows an exemplary matrix array of diodes able to be used with a headlamp according to the invention.
Figure 6:
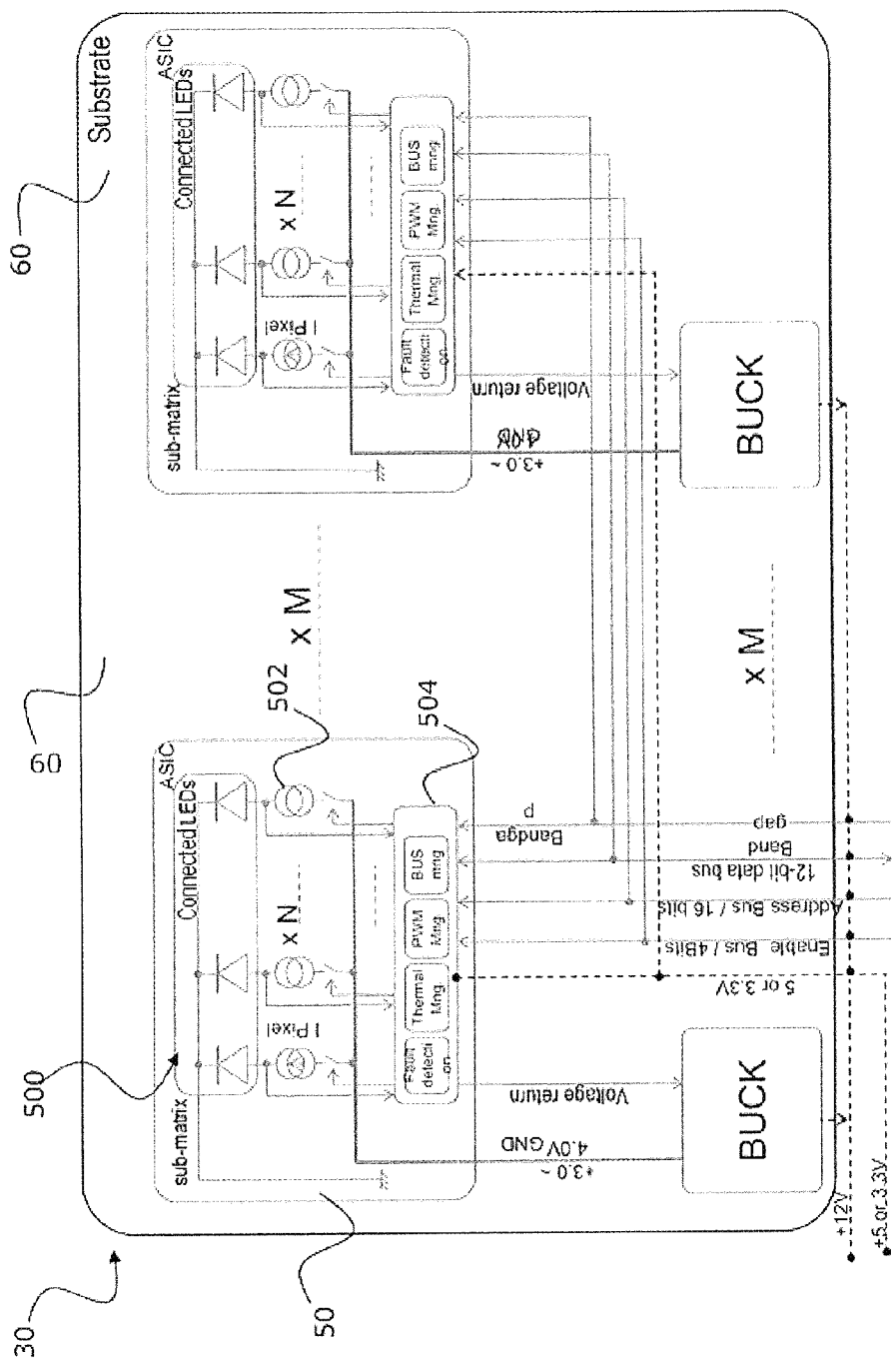
FIG. 6 shows a detailed view of a sub-matrix array of FIG. 5.

FIGS. 5 and 6 show an exemplary configuration of an LED matrix array that may be used with the examples of FIGS. 3*a* and 3*b*.

In the example in FIG. 5, the matrix array is composed of an LED array assembly (or LED sub matrix) the LEDs of which are aligned in two rows 510, 512 or sub-matrix arrays 50 and thus form a sub-matrix array grid 50 arranged on a carrier 60 (also called a substrate 60). Each sub-matrix array 50 includes an application-specific integrated circuit (ASIC) that is configured to manage the LEDs of each sub-matrix array. The management in particular includes the configuration of one or more LEDs of the sub-matrix array to emit light or even as light detector. It will be understood that an ASIC may manage one or more sub-matrix arrays, as will be discussed with reference to FIG. 9*a*.

The centralized management of the sub-matrix arrays is achieved using a control unit 54 that may be a field-programmable gate array (FPGA), which communicates with the ASIC of each sub-matrix array by virtue of buses 1560, 1562, 1564, 1566, that are respectively a bus 1560 for transferring/receiving data to/from the ASIC of a sub-matrix array, an address bus 1562 in order to select the ASIC with which to communicate, a bus 1564 for triggering a state of a sub-matrix array and a bus 1566 for reading from/writing to an ASIC of a sub-matrix array. The control unit may be connected to a video source (for example a video camera) via a specialized video interface; for example an HDMI (high-definition multimedia interface) or even a DVI (digital visual interface). This allows the control unit to reconfigure the LED matrix array depending on a received video signal. The video source may also be provided by an advanced driver assistance system (ADAS) as known in the prior art.

Each sub-matrix array is powered electrically by a voltage converter 52 that converts the electrical voltage of the supply line 514 into a lower electrical voltage. The voltage converter may be a BUCK converter. The voltage converter allows the ASIC of each LED sub-matrix array to be supplied with power. Each sub-matrix array is also supplied with power by a second supply line 512 that has a different voltage to that of the first line; for example, the second line delivers the current required by the LEDs of each sub-matrix array so that it may illuminate the scene (i.e. emit light).

FIG. 6 shows a detailed example of sub-matrix arrays 50. Each sub-matrix array includes a plurality of LEDs that are mounted in parallel, and each LED is powered individually by a current source 502. The management of the LEDs of the sub-matrix array is ensured by the ASIC 504 that in particular comprises functions for managing the buses, the electrical power supply, temperature and for detecting problems with the LEDs.

Figure 9A:
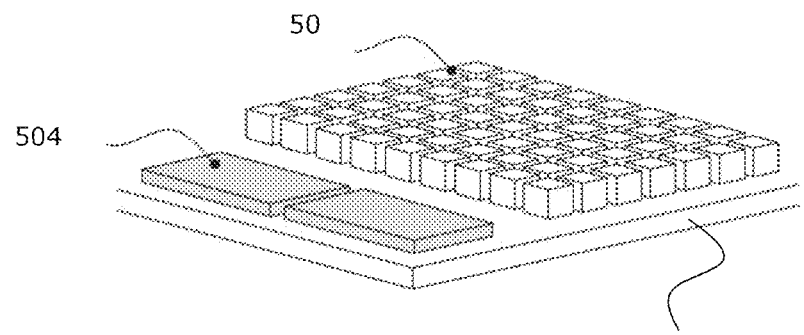
FIGS. 9a, 9b, and 9c show examples of matrix arrays of diodes.
Figure 9B:
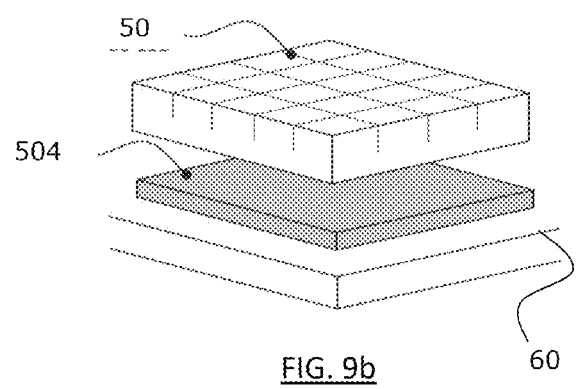
Figure 9C:
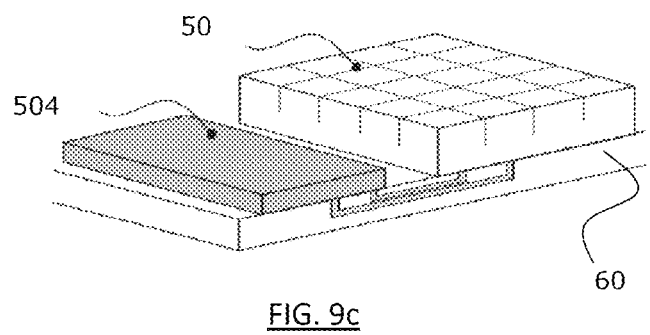

It will be understood that the examples of FIGS. 5 and 6 may be modified depending on technological changes to the LED matrix arrays or even depending on technological choices, as illustrated in FIGS. 9*a*, 9*b*, and 9*c*. For example, the matrix array may not be made up of sub-matrix arrays and comprise one and only one LED matrix array in which each LED may alternatively serve as light sensor and light emitter.

FIGS. 9*a*, 9*b*, and 9*c* show other examples of LED matrix arrays. FIG. 9*a* shows an example similar to that discussed with reference to FIG. 5 except that one ASIC manages a plurality of sub-matrix arrays. It will be understood that one ASIC could also manage a plurality of independent LEDs assembled together to form an LED matrix array. FIG. 9*b* shows an example in which the matrix array does not comprise sub-matrix arrays but only a single matrix array. Still in this example, an ASIC (controlling the LED matrix array) is located between a carrier 60 and the LED matrix array. FIG. 9*c* shows an example similar to that of FIG. 9*b*, but in this example the ASIC and the LED matrix array are both located directly on the carrier 60.

Returning to FIG. 3*a*, the LED matrix array is arranged on the ASIC so that the semiconductors are placed on connection lands that are arranged, in a configuration chosen beforehand, and located on an insulating carrier element that includes the ASIC that controls the array of P and N junctions of the LEDs.

In FIG. 3b, the LED matrix array 30b is positioned so as to illuminate the matrix array of mirrors 34 that is itself positioned on the carrier 60.

In FIG. 3b, the LED 30c is positioned so as to illuminate the matrix array of mirrors 34 that is itself positioned on the carrier 60.

The headlamp of FIGS. 3a, 3b, 3c may be adapted to be coupled to a control unit that configures the operation of the one or more LEDs. The control unit may for example be the FPGA 54 presented with FIGS. 5 and 6. The control unit may configure one or more LEDs so that they emit light, i.e. it individually controls the electrical power supply of each diode. This control is achieved as in the prior art; for example, the FPGA sends via one or more buses an order to the ASIC(s) in question, which will in turn place the LEDs that must emit light under voltage. The control unit may also receive the information that one or more LEDs have detected a light source: the control unit may read the electrical current generated by an LED that has detected a light source. In practice, the ASIC of the sub-matrix array with which the LED that has detected a light source is associated sends a message to the control unit via one or more buses and the control unit is configured to identify the LED. The control unit may therefore individually command the operation of each LED (alternately as light emitter or indeed as detector of light sources), and it is also configured to determine which if any LEDs have detected a light source. It will be understood that the change from one operating mode to the other may occur either in an LED that is emitting light or indeed in an LED that is serving as a detector.

The control unit is coupled to the headlamp using conventional means (for example an electrical circuit). The headlamp according to the invention may comprise the control unit.

The control unit may also transmit a synchronization signal that serves to synchronize the operation of the first headlamp with that of a second headlamp according to the invention. The synchronization signal indicates what the operating mode of one or more LEDs controlled by the control unit is to be. The synchronization signal is typically a synchronization pulse; for example a rectangular electrical signal of a pre-set height and pre-set width, or even a command on a communication bus such as a CAN (controller area network), Ethernet, CAN FD (flexible data-rate) or FlexRay bus. The synchronization signal is conveyed from the control unit to a second headlamp using a bus (that may be dedicated to this function or not) it being understood that the bus may be, but is not limited to, a physical link (an electrical wire for example) or even a wireless (Bluetooth® for example) link. In practice, the bus may be a physical link, this obtaining a better propagation speed and a greater guarantee of good transmission of the synchronization signal.

The control unit may also modify the operation of one or more LEDs on reception of a synchronization signal. Thus, on reception of an external signal, the control unit may trigger the emission of light by one or more LEDs, or even trigger the operation of one or more LEDs as detector of light sources. The received synchronization signal is conveyed using means similar to those used to send the synchronization signal.

The control unit may be configured to only send a synchronization signal, or indeed to only receive a synchronization signal, or even to send and to receive a synchronization signal. In practice, the control unit is configured to send and to receive a synchronization signal because this facilitates the assembly and configuration of a device using at least two headlamps according to the invention, as for example described below with reference to FIG. 4.

The sending and/or reception of a synchronization signal may be managed by a synchronization sub-unit itself managed by the control unit.

The control unit may also comprise a video input allowing it to reconfigure the LED matrix array of FIGS. 3a and 3b or indeed the matrix array of mirrors of FIGS. 3b and 3c depending on a received video signal. For example, if a video camera detects (it films) a vehicle coming toward the vehicle equipped with headlamps according to the invention, the control unit may command one or more LEDs of the matrix array of FIGS. 3a and 3b to be turned off in order not to illuminate the approaching vehicle, or even in order not to illuminate a portion of the approaching vehicle (the windshield for example); or the control unit may even command the position of one of mirrors of FIGS. 3b and 3c in order that they do not reflect the light emitted by the LED matrix array 30b or the LED 30c in the direction of the approaching vehicle, or even in the direction of a portion of the approaching vehicle (the windshield for example). The one or more LEDs may be occluded, or the one or more mirrors positioned, following the reception of a video signal by implementing known means for occluding headlamp light sources or known means for managing the positions of mirrors. The control unit may furthermore also be used to send information to other road users, for example in order to warn them of the presence of a pedestrian crossing, of a danger, etc.

The headlamp of FIGS. 3a, 3b, and 3c may also comprise a system of lenses 32 that allows the emission of the LEDs to be modified. LED lenses are frequently used to increase the angle of the light and therefore increase the illuminated field of view (FoV).

The control unit of FIGS. 3a and 3b may have at least one memory allowing it to record which LED has detected a light source. The memory may store a table in which each cell of the table is associated with a single LED of the matrix array, and the value stored in the cell indicates whether the LED has detected a light source (the value is for example "1") or has not detected a light source (the value is for example "0"). Other ways of recording a detected light source are envisionable. For example, the memory may be capable of storing additional information other than simply whether a light source has been detected. As another example, the memory may be capable of storing a value of the detected light flux (the current generated by an LED varies proportionally to the amount of light detected), or even of storing the type of luminous object that has been detected (for example a raindrop, a puddle, a road sign, etc.).

The control unit of FIG. 3c may have at least one memory allowing it to record which are the mirrors, when they have been in the position allowing light to be reflected toward the LED, for which the LED 30c has detected a light source. The memory may store a table in which each cell of the table is associated with a single mirror of the matrix array, and the value stored in the cell indicates whether the LED has detected a light source when the mirror was in the position allowing the light source to be reflected toward the LED. It will be understood that the exemplary ways of storing discussed with reference to FIGS. 3a and 3b may be adapted to the control unit of FIG. 3c. The control unit may include two memories. The first memory records (or indeed stores)

which LEDs of the matrix array detected a light source or which mirrors reflected a light source toward the LED when the one or more LEDs last operated as detectors of a light source, relative to the time at which the recording is made. The second memory records (or indeed it stores) which LEDs of the matrix array detected a light source or which mirrors reflected a light source to the LED when the LED was operating as a detector of a light source the time before last, relative to the time at which the recording is made. The time before last the one or more LEDs operated as detectors of a light source should be understood to mean the time followed by operation as a light emitter and detector of light sources. The first memory therefore contains the results of the most recent detections, and the second memory contains the results of the detections preceding the most recent. When new detection results are read (one could also say acquired) by the control unit, the two memories may be managed as follows: the results stored in the first memory are transmitted to the second memory that replaces the old results with the results transmitted thereto; after this, the new results of the detection are recorded to the first memory.

Alternatively, the new results of the detection are written over the results contained in the memory storing the oldest results. It will be understood that in this variant, the first memory is no longer defined as that containing the results of the most recent detections. This makes it possible to avoid having to transfer data between the two memories, which may be costly, but requires that the control unit know which of the two memories contains the results of the oldest detections. It will be understood that the way in which the memory is managed (in particular as regards the writing/reading/deletion of the data that are stored therein) may depend on the type of memory, and/or its technology, and/or the control unit.

The control unit may also include a computational unit that computes the speed of movement and direction of movement of a detected light source by comparing the records of the first memory and the second memory. The comparison of the data stored in the two memories allows, in each new detection cycle of the LEDs, the new position of previously detected light sources to be determined. The number of detected light sources may be high; typically, when the elements reflecting the light of the headlights of the vehicle are raindrops (in this case, each raindrop is considered to be a light source), hypotheses representative of a statistically measured behavior of the reflective elements (for example raindrops) may be used; these hypotheses allow the most probable positions of the raindrops between two detections to be determined in order to eliminate certain movements that could be measured during the comparison of the data of the two memories.

For example, the speed of movement of the raindrops may be computed by correlation of two images taken at two different times with image-correlation (cross correlation or global correlation) software packages such as those for example used in the measurement of the deformation of matter (strength of materials). Here, the term image means a record in one of the memories of the results of the detection of the LEDs of a matrix array, or else of those mirrors for which the LED detected a light source when said mirrors were in the position allowing the light source to be reflected toward the LED. An image (stored in one of the memories of the headlamp) is a representation of a scene in which the one or more detected light sources of the scene have a representation that differs from the rest of the scene. The document R. Cintrón, V. Saouma, "*Strain Measurements with the Digital Image Correlation System Vic-2D*", 2008, describes an example of a correlation method applied to spot-deformation measurements during the deformation of matter under stress. Other methods may be used, these methods for example being based on iterative least square (ILS) algorithms or even pointwise least square (PLS) algorithms.

In addition, the computation that allows the new position of previously detected light sources to be determined may take into account factors external to the measurements made by the headlamp. These external factors may for example be the speed of movement of the vehicle (the control unit may be configured to receive in real time information relating to the speed of the vehicle). Another exemplary external factor is the information contained in a video signal received by the control unit; a video camera on board a vehicle may allow the detected light sources to be grouped according to one or more criteria such as for example their origin (raindrop, headlight of an oncoming vehicle) with a view to applying to each group different hypotheses representative of a statistically measured behavior.

Figure 7:
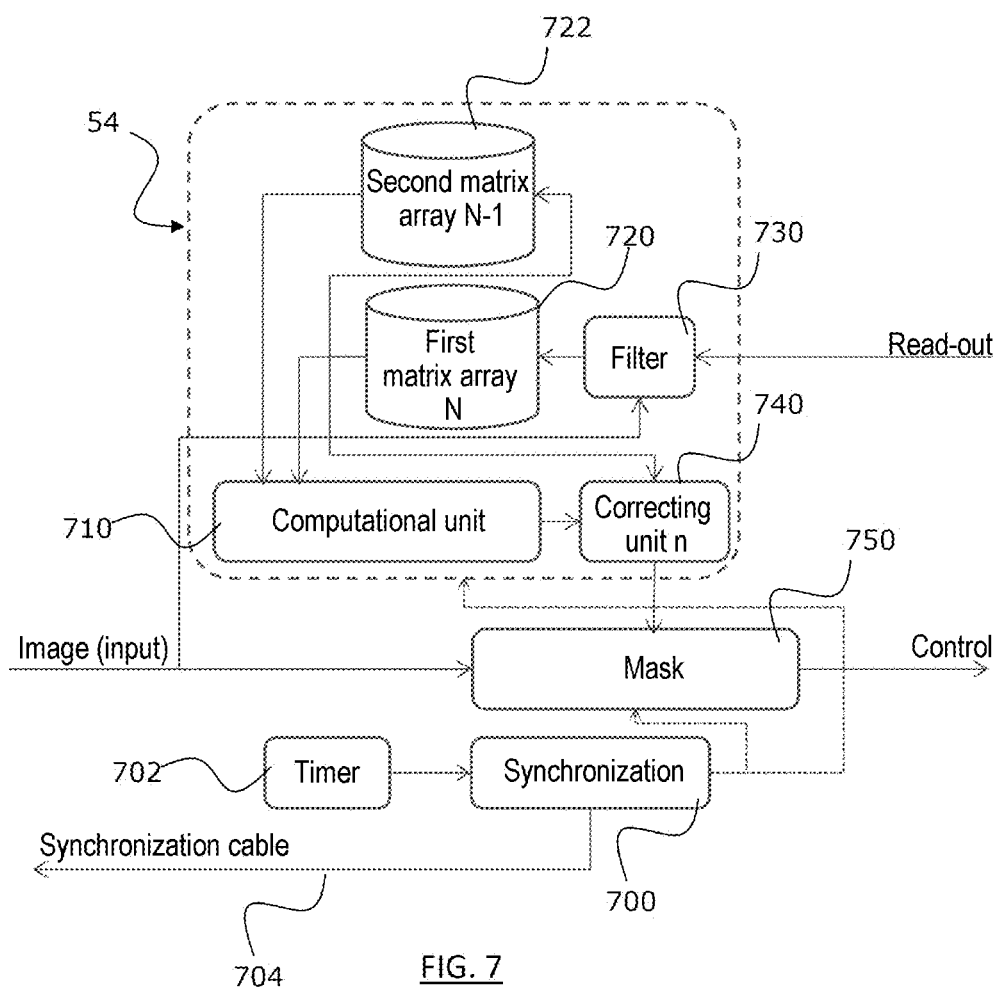
FIG. 7 shows an exemplary control unit of a projector according to the invention.

FIG. 7 shows an example of a control unit 54 of a headlamp according to the invention. It comprises a synchronization unit 700 allowing a synchronization signal to be sent for example via the cable 704. The control unit may be associated with a timer 702 for example making it possible to set when the speed of movement and the direction of movement of a light source must be computed, for example by the computational unit 710; or even making it possible to set when to use a mask on the headlamp as explained below. The computational unit 710 is also connected to a first memory 720 to which the new detection results are recorded (these results being referenced N) and a second memory to which the preceding detection results are recorded (these results being referenced N−1). Before being recorded, the new detection results may be filtered by a filtering unit 730. The filtering may for example comprise creating groups of light sources depending on their origin. The output of the computational unit may be connected to a computation-correcting unit 740 that is in charge of applying, to the results delivered by the computational unit, corrections depending for example on the external factors discussed above. From the output of the computational unit 710, or of the computation-correcting unit 740 where appropriate, a mask-computing unit 750 determines which LEDs of the matrix array or indeed which mirrors of the matrix array will be allowed to contribute to illumination of the scene. With this aim, the mask-computing unit computes a mask that can be applied to the LED matrix array or the matrix array. The mask allows, in a matrix array of LEDs or mirrors, a subset of LEDs to be activated to emit light or a subset of mirrors to be positioned to reflect the light emitted by at least one LED, or, in contrast, a subset of LEDs to be deactivated or a subset of mirrors to be positioned in order not to reflect the light emitted by at least one LED. The choice of the LEDs to activate or mirrors to place in a set position is made depending on data delivered by the computational unit 710 or computation-correcting unit 740; the computation of the mask comprises applying, to each recently detected light source (i.e. to the records of the memory 720), the speed of movement and direction of movement computed by the unit 710, or 740 where appropriate.

Thus, the image stored in the second memory is modified depending on predictions of the movement of the detected light sources, and this modified image serves as a mask allowing one or more spaces of the scene to be occluded. The mask serves to prevent one or more LEDs of the headlight from illuminating zones of the scene comprising elements that are liable to reflect the light emitted by the headlamp, and that are therefore liable to dazzle the driver of the vehicle. The mask is therefore a grid each of the cells of which is in correspondence with an LED of the matrix array or even with a mirror of the matrix array. The cells of this grid correspond to the future positions computed for the elements that are liable to reflect the light emitted by the headlamp, these positions being computed for a pre-set period of headlamp activation, are cells for which the corresponding LEDs are not turned on or the corresponding mirrors are not positioned to reflect the light of the LED when the headlamp is emitting light. Therefore, these elements that are liable to reflect light will not reflect the light emitted by the headlamp.

The mask may furthermore be computed so that additional zones of the scene, other than those comprising elements that are liable to reflect the light emitted by the headlamp, are also not illuminated. For example, the mask-computing unit 750 may be connected to a video source (for example a video camera) via a specialized video interface such as discussed above. The mask-computing unit interprets the received video information and determines the zones of the scene not to illuminate. Known means and algorithms may be used to this end. For example, a simple method may consist in adding the computed mask and the image delivered by the video source.

Figure 4:
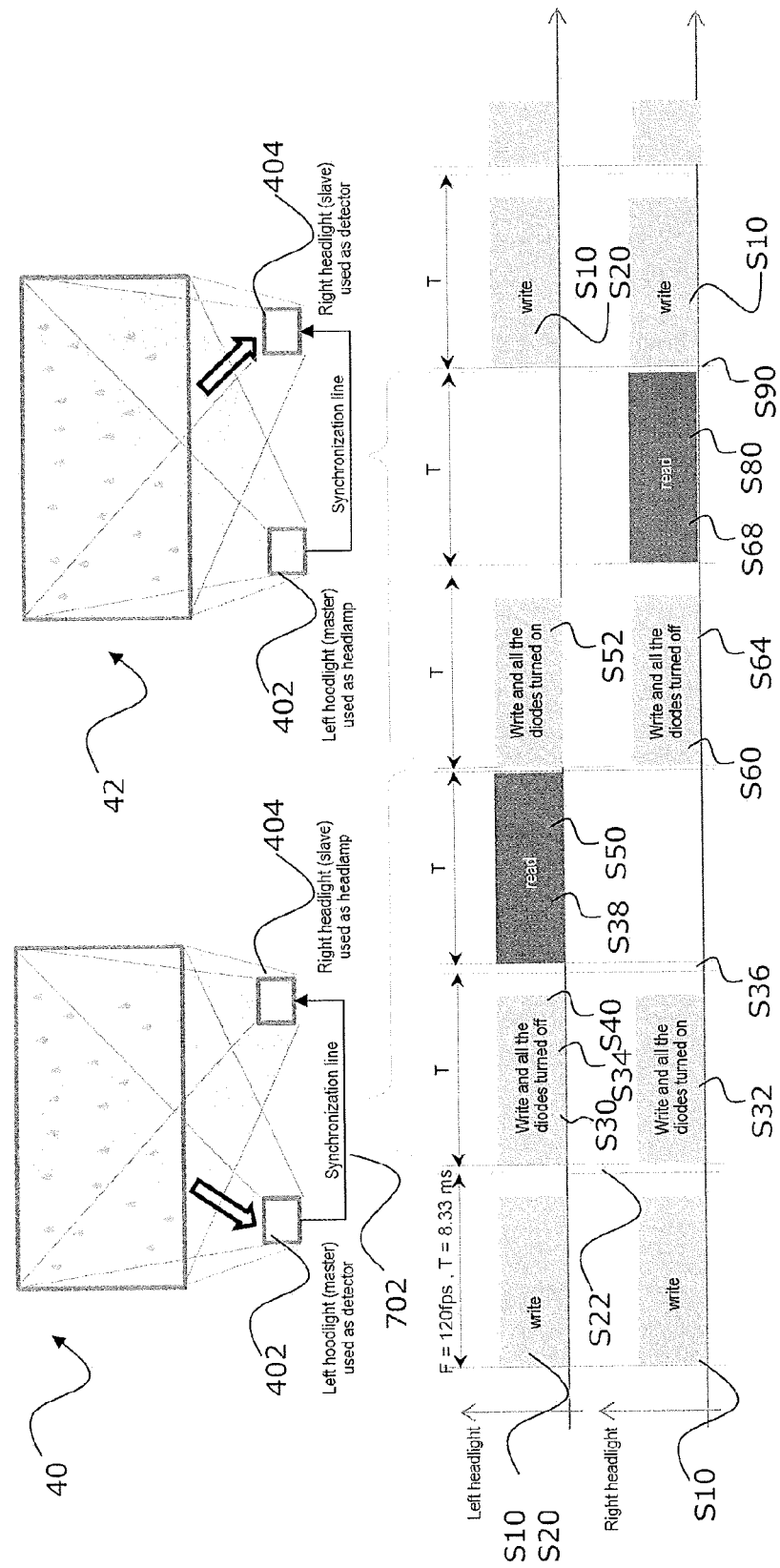
FIG. 4 shows an example of the operation of a device according to the invention.

FIG. 4 describes an example of a device for lighting a scene that comprises two headlamps according to the example of FIG. 3a. In this example, the headlamps are front headlights of an automobile, which detect the speeds of movement and the directions of movement of raindrops, and which modify the lighting they provide depending on the results of the detection in order to decrease the reflection of the headlights of the automobile from raindrops. The device may also be applied to lights located at the rear of the vehicle in order to optimize the shots taken by a rear video camera for example. Each of the two headlamps comprises a control unit that configures the operation of the LEDs of its matrix array and allows a synchronization signal to be sent and received, a control unit, and two memories allowing the results of its detection to be recorded. The device includes a first headlamp 402 that is called the master headlamp because it is the control unit of the headlamp 402 that sends the synchronization signal indicating to the second headlamp 404 that it must emit light or indeed detect light sources. The second headlamp is called the slave headlamp because it changes operating mode only after it has received the synchronization signal. In this example, all the LEDs of the matrix array of a headlamp adopt the same operating mode. Thus, as shown in the device 40, when all the LEDs of the matrix array of the master headlamp 402 are operating as detectors, all the LEDs of the slave headlamp 404 emit light. Conversely 42, after the master headlamp has transmitted the synchronization signal, all the LEDs of the master headlamp emit light and all the LEDs of the slave headlamp detect the light sources (i.e. the raindrops reflecting the light emitted by the master headlamp and forming light sources). The two headlamps are connected via a bus over which the synchronization signals are passed, for example an electrical cable (or wire) dedicated to the synchronization of the two headlamps.

An example of the co-operation between the master headlamp and the slave headlamp and the internal operation of each headlamp is now described with reference to the functional block diagram in FIG. 8.

In step S10, the two headlamps emit light, typically a road and its edges; they for example play the role of high-beam or low-beam headlights. Depending on the result of a previous detection, the matrix arrays of the two headlamps may have two configurations:

(i) if the last detection revealed no light source, the LEDs of each headlamp emit light and illuminate the scene. Alternatively the number of LEDs may be decreased according to a pre-set scheme; for example, the headlamps may be made to operate as low-beam lights that must not deliver the same lighting power as the same headlamps operating as high-beam lights.

(ii) if the last detection revealed light sources for one headlamp and/or the other headlamp, the LEDs that emit light in each headlamp are selected by virtue of a mask obtained from a prior computation of the speeds of movement and directions of movement of the previously detected light sources.

Step S10 is triggered when a synchronization message for synchronizing the master headlamp with the slave headlamp is sent: once the synchronization has been sent, the master headlamp emits light and the slave headlamp emits light once the signal has been received. In practice, the transmission time of a synchronization signal is a few milliseconds, so that the driver does not observe the shifted turn on of the two headlamps.

In step S20, a timer is triggered. It may be triggered at the same time as the synchronization signal is sent in step S10. The timer serves to measure an amount of time that has passed. Provided that the amount of time has not passed, the two headlamps are kept in a lighting mode, for example a high-beam lighting mode. This time may be pre-set; for example, the measured duration may be comprised between 0.5 and 5 seconds, and is preferably about one second. This time may be determined dynamically. For example, if a previous detection revealed very many raindrops acting as light sources, this means that the rain is heavy and that it is therefore necessary to repeat the detections more often.

Once the time has passed (S22), the master headlamp sends a synchronization signal to the slave headlamp. This signal is interpreted by the control unit of the slave headlamp as an order (S24) to turn on all the LEDs of its matrix array. The control unit of the slave headlamp (S32) triggers the supply of electrical current to all the LEDs that it manages.

Again subsequent to the test S22, the master headlamp performs the following two operations.

The first operation comprises three successive sub-operations, namely: (i) making all or some of the LEDs (S30) of the matrix array of the master headlamp operate as detectors of light sources; no longer do any LEDs of the master headlamp emit light; (ii) reading from the matrix array of the master headlamp (S34), with the control unit of the master headlamp, which are the LEDs that have detected a light source; (iii) sending a synchronization signal to the slave headlamp, which is interpreted by the control unit of the slave lamp as an order (S36) to switch off (S60) all the LEDs of the matrix array of the slave headlamp: the detection of the matrix array of the master headlamp has completed.

The second operation comprises copying (S40) to the second memory information contained in the first memory. The second memory thereafter stores the records of the time-before-last operation of the LEDs of the master headlamp.

In practice, these two operations start at the same time. It may be envisioned to make them start with a time shift, or indeed to carry them out one after the other. It is preferable for the copy S40 to be produced as rapidly as possible in order for the result of the read-out of step S34 to be rapidly recorded (S38) to the first memory of the master headlamp.

In step S50, the control unit of the master headlamp computes the mask as discussed with reference to FIG. 7.

In step S52, the control unit of the master headlamp commands all the LEDs of the matrix array to be turned on, and that they remain turned on until the master headlamp receives a synchronization signal sent by the slave headlamp.

After step 36, i.e. after the slave headlamp has received the synchronization signal interpreted by the control unit of the slave headlamp as an order (S36) to turn off all the LEDs, the slave headlamp carries out the following two operations.

The first operation comprises ceasing to make operate (S60) all or some of the LEDs of the matrix array of the slave projector, which no longer emit light. The LEDs then operate as detectors of light sources.

The second operation comprises copying (S70) to the second memory of the slave headlamp the recordings contained in the first memory of the slave headlamp. The copy completed, the second memory therefore stores the records of the time-before-last operation of the LEDs of the slave headlamp. This step S70 is therefore similar to that carried out by the master headlamp in step S40.

In practice, these two operations start at the same time. They may be made to start with a time shift, or indeed they may be carried out one after the other. It is preferable for the copy S70 to be produced as rapidly as possible in order for the result of the read-out of step S64 to be rapidly recorded (S68) to the first memory of the slave headlamp.

Thus, after all the LEDs have been stopped, the control unit of the slave headlamp reads the LEDs of the matrix array that it controls and determines (S64) which are the LEDs that have detected a light source.

The results read by the control unit are recorded to the first memory (68). This step S68 is similar to that carried out by the master headlamp in step S38.

Next, in step S80, the slave headlamp performs a mask computation in the same way as that performed beforehand in step S50 by the master headlamp.

The read-out of step S64 terminated, the slave headlamp sends a synchronization signal to the master headlamp that interprets it as meaning that the control unit of the slave headlamp has terminated the read-out of the LEDs of the matrix array operating as detectors.

The detection cycle has therefore completed, and a road lighting cycle that takes into account the results of the detection is now implemented.

The timer activated in step S20 is zeroed as soon as step S80 is over. Following the reset 590, the two headlamps emit light and each headlamp applies the mask (S10) computed in steps S50 and S80, respectively.

Once the time measured by the timer has passed (S20, S22), a new detection phase of the method is repeated for as long as the headlamps of the vehicle must illuminate the scene.

The elements of the scene reflecting the light emitted by the headlamps such as raindrops are thus detected locally by each headlamp, and the results of the detection are also exploited locally by each headlamp. There is therefore no need for additional computations the aim of which would be to compensate for a positional difference between the location at which the detection occurs and the location of the headlamp, contrary to the case of a solution using a single video camera that is not located in the headlamps. In addition, all the operations that require a computation and the preparation of the data required to perform these computations are carried out by and for each headlamp: there is therefore no latency introduced for example by a data transfer, or at the very least the latency is decreased to local transfers in the headlamp. The only transfers of data out of the headlamp are the synchronization messages sent, which present no technical difficulty as regards implementation; the transfer of synchronization messages is also extremely rapid and may even be subject to real-time time constraints allowing the device according to the invention to operate extremely rapidly, in particular as regards the detection. Furthermore, one and the same LED matrix array may in turn serve as detection component and lighting component: the decrease in the number of components facilitates the integration of the functions required for the detection, and the reliability of the headlamp and of the device according to the invention.

FIG. 4 shows an example of the timing of the steps of the method such as it may be executed by the device according to the invention. It should be noted that one or more steps of the method may be grouped together in order to be executed in one pre-set period. For example, in FIG. 4, the data are read and the masks computed during one period of duration of about 10 ms, it being understood that the duration of the periods varies depending on criteria such as (but not limited to) the size of the matrix array, the computational power of the computational unit, etc. Advantageously, each step of the method according to the invention belongs to one of the sequences so that the method is executed in a pre-set time. The operation of the device according to the invention may therefore meet real-time time constraints. The illumination of the road is therefore not affected by the detection and the safety of the vehicle is not compromised.

Variants of the described method may be implemented. For example, rather than the slave headlamp sending a synchronization signal to the master headlamp once step S64 has terminated, the master headlamp may send in step S66 a synchronization signal to the slave headlamp in order to signal thereto that the LEDs of its matrix array must be read out. In this case, the master headlamp may comprise a timer that measures the time passed from the moment when the master headlamp sent the synchronization signal after step S34, in order to leave a sufficient amount of time for the slave headlamp to detect light sources. In this variant, only the headlamp manages the triggering of the various steps.

When the detectors make their first detection, typically when the headlights of an automobile are requested to turn on for the first time, the two memories contain no information. It is necessary, to perform the computations of steps S50 and S80, for the two memories to contain the results of a detection. Two detections (S22 to S80) may be carried out consecutively in order for the two memories to be loaded with the detection measurements taken by the LEDs. The time of a detection is about a few tens of milliseconds, so that the driver does not observe any shift between the order to turn on the headlamps and the actual turning on of the headlamps.

Figure 8:
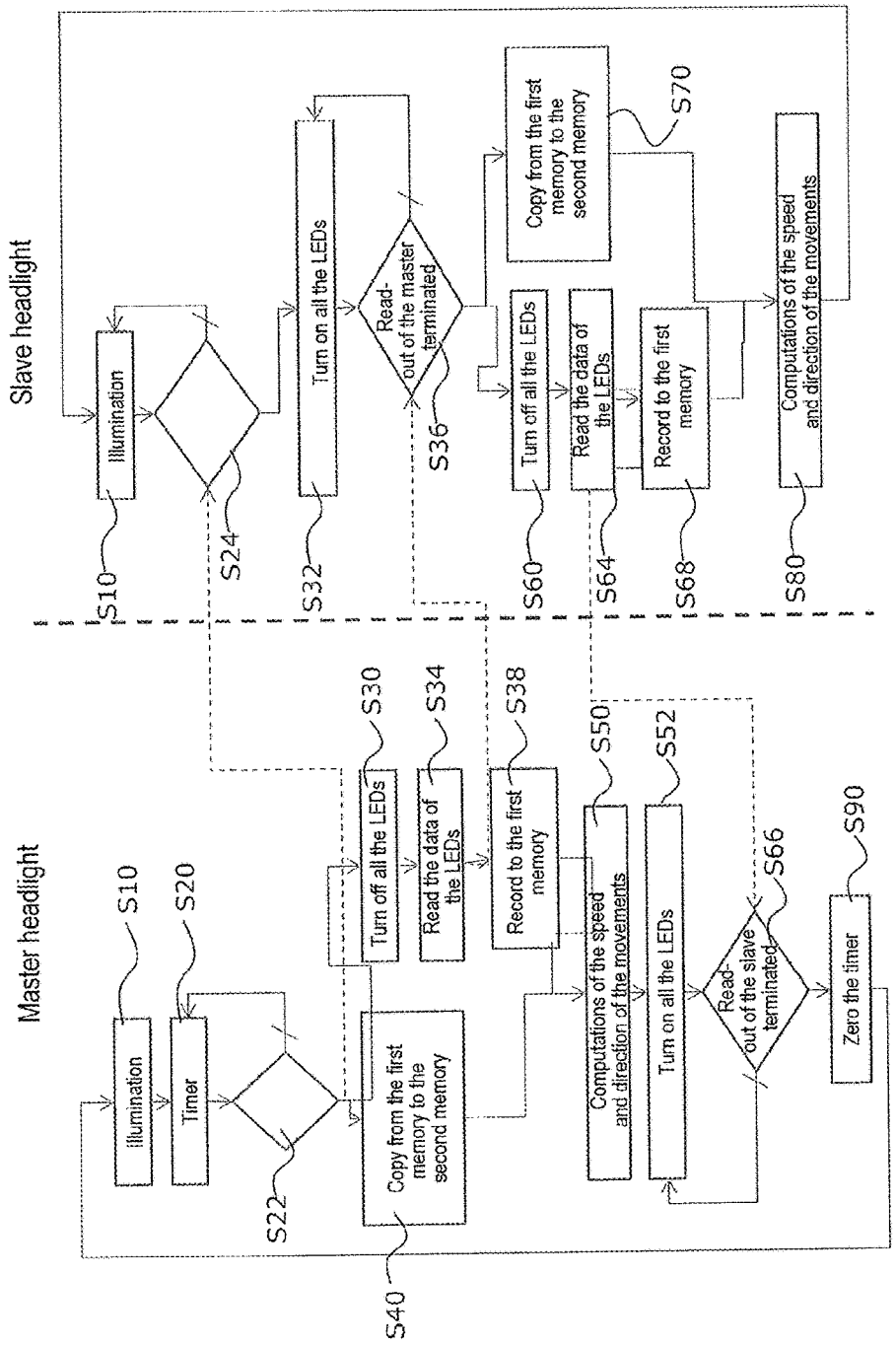
FIG. 8 shows an exemplary functional block diagram of a device using the detecting and occluding method according to the invention.

FIGS. 4 and 8 were described with headlamps according to the example of FIG. 3a. It will be understood that the examples of FIGS. 3b and 3c do not modify the described way in which the master headlamp and the slave headlamp cooperate. Specifically, the difference between FIGS. 3a, 3b and 3c is the way in which light is emitted and received, directly with FIG. 3a, and indirectly with FIGS. 3b and 3c. Thus, the way in which the light sources emitted by the headlamp (originating either directly from the LEDs of the matrix array, or reflected by the mirrors) is controlled is different. The example of FIG. 3b is a "hybrid" mode comprising an LED matrix array and a mirror matrix array. It will be understood that it is possible to use both the position of the mirrors and the list of diodes having detected a light source to compute the mask, and likewise the way in which the mask is applied.

Figure 10A:
FIGS. 10a and 10b show exemplary configurations of a device according to the invention.
Figure 10B:
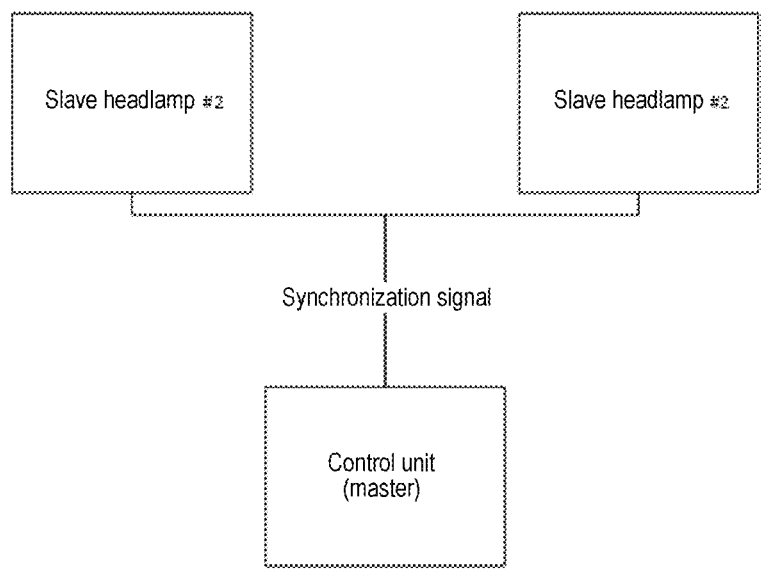

In the above examples, the synchronization between the two headlamps was directed by the headlamp called the "master" headlamp, i.e. the synchronization signals were sent by the master headlamp to the slave headlamp, as shown by the diagram in FIG. 10a. In practice, the two headlamps comprise the computational unit. In another example, the synchronization between the two headlamps is controlled by a control unit coupled to the two headlamps, i.e. there is one control unit that is common to the two headlamps, as shown by the diagram in FIG. 10b. In this case, the two headlamps operate as slaves. It will be noted that in the latter case that some of the elements which may be comprised in a control unit specific to each headlamp are not implemented in a control unit common to the two headlamps. In particular, each headlamp retains its first and second memories and its computational unit, so that the control unit may serve only to send the synchronization signals and may comprise one or more timers in order to determine when to send the synchronization signals. This makes it possible for the data captured by each headlamp not to have to transit over a network, thereby allowing the computations to be carried out more rapidly.

The invention claimed is:

1. A vehicle headlamp comprising:
   at least one light-emitting diode, wherein said at least one light-emitting diode is configured to operate as a detector of a light source; and
   a first memory that records whether said at least one light-emitting diode detects the light source when said at least one light-emitting diode last operated as the detector of the light source.

2. The headlamp according to claim 1, suitable for being coupled to a control unit that is configured to make said at least one light-emitting diode operate alternately as the detector of the light source and as a light emitter.

3. The headlamp according to claim 2, wherein the control unit is furthermore configured to transmit a synchronization signal indicating whether said at least one light-emitting diode is operating as the light emitter or as the detector of the light source.

4. The headlamp according to claim 3, wherein the control unit is furthermore configured to alternate the operation of said at least one light-emitting diode on reception of the synchronization signal.

5. The headlamp according to claim 1, furthermore comprising:
   a second memory that records whether said at least one light-emitting diode detects the light source when said at least one light-emitting diode operated the time before last as the detector of the light source.

6. The headlamp according to claim 5, furthermore comprising a computational unit that computes a speed of movement and a direction of the movement of the light source by comparing the records of the first and second memories.

7. The headlamp according to claim 1, wherein a diode matrix array comprises said at least one light-emitting diode.

8. The headlamp according to claim 7, wherein a matrix array of mirrors reflects the light source when the light source is emitted or detected by said at least one light-emitting diode of the matrix array.

9. The headlamp according to claim 7, wherein all the at least one light-emitting diode of the matrix array operate alternately as light emitters and as detectors of one or more light sources.

10. The headlamp according to claim 1, wherein a matrix array of mirrors reflects the light source when the light source is emitted or detected by said at least one light-emitting diode, the mirrors of the matrix array being configured so that only a single mirror can reflect toward said at least one light-emitting diode a light source.

11. A lighting device comprising at least two headlamps according to claim 1, including a first headlamp and a second headlamp.

12. The device according to claim 11, wherein each of said at least two headlamps comprises a control unit, the control units being connected to one another in order that a synchronization signal transmitted by the control unit of one of the headlamps be received by the control unit of the other headlamp.

13. The device according to claim 11, wherein said at least two headlamps are coupled to a control unit configured to transmit a synchronization signal indicating whether said at least one light-emitting diode is operating as a light emitter or as the detector of the light source to the headlamps.

14. The device according to claim 11, wherein each of said at least two headlamps comprises a computational unit that computes a speed of movement and a direction of the movement of the light source.

15. The device according to claim 11, wherein said at least two headlamps are furthermore configured to simultaneously emit light.

16. The headlamp according to claim 7, wherein the first memory records which light-emitting diode or light-emitting diodes of the diode matrix array detects the light source.

17. The headlamp according to claim 8, wherein the first memory records which mirror or mirrors from the matrix array of mirrors are in a position allowing light to be reflected towards the at least one light-emitting diode when the light source is detected by said at least one light-emitting diode.

18. A method for detecting and occluding light sources with a lighting device comprising a first headlamp and a second headlamp that each include at least one light-emitting diode, said at least one light-emitting diode being configured to operate as a detector of a light source, the method comprising:
   sending a first synchronization signal;
   after the first synchronization signal has been sent:
      emitting light with said at least one diode of the second headlamp; and
      making said at least one diode of the first headlamp operate as the detector of the light source;
   recording in a first memory of the first headlamp whether said at least one diode of the first headlamp detected the light source;
   sending a second synchronization signal;
   after the second synchronization signal has been sent:
      emitting light with said at least one diode of the first headlamp; and
      making said at least one diode of the second headlamp operate as the detector of the light source;
   recording in a first memory of the second headlamp whether said at least one diode of the second headlamp detected the light source.

19. The method according to claim 18, furthermore comprising:

recording, in a second memory of the first headlamp whether said at least one diode of the first headlamp deleted the light source;

recording, in a second memory of the second headlamp, whether said at least one diode of the second headlamp deleted the light source;

after the recording in the second memory of the first headlamp, computing with a computational unit of the first headlamp a speed and a direction of movement of the light source detected by the first headlamp and determining diodes of a matrix array of a first projector of the first headlamp allowed to emit light depending on the computation;

after the recording in the second memory of the second headlamp, computing with a computational unit of the second headlamp a speed and a direction of movement of the light source detected by the second headlamp and determining diodes of a matrix array of the second headlamp allowed to emit light depending on the computation;

sending a third synchronization signal; and after the third synchronization signal has been sent, configuring the first and second headlamps so that they simultaneously emit light, only those diodes determined as being allowed to emit light being activated.

* * * * *